United States Patent
Ota et al.

(10) Patent No.: US 9,611,540 B2
(45) Date of Patent: Apr. 4, 2017

(54) ELECTROSTATIC CHUCK SHIELDING MECHANISM

(75) Inventors: Kan Ota, Bedford, MA (US); Stanley W. Stone, Gloucester, MA (US); Steve T. Drummond, Merrimac, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 2598 days.

(21) Appl. No.: 12/340,936

(22) Filed: Dec. 22, 2008

(65) Prior Publication Data

US 2010/0159153 A1    Jun. 24, 2010

(51) Int. Cl.
  *C23C 14/50*  (2006.01)
  *C23C 14/48*  (2006.01)
  *C23C 14/56*  (2006.01)
  *H01J 37/317*  (2006.01)

(52) U.S. Cl.
  CPC ............ *C23C 14/48* (2013.01); *C23C 14/564* (2013.01); *H01J 37/3171* (2013.01); *H01J 2237/022* (2013.01)

(58) Field of Classification Search
  CPC .................................................... C23C 14/48
  USPC .................................................. 118/719, 504
  See application file for complete search history.

(56) References Cited

U.S. PATENT DOCUMENTS

| 6,710,360 B2 * | 3/2004 | Ferrara ................... 250/492.21 |
| 6,918,735 B2 * | 7/2005 | Urban et al. ................... 414/729 |
| 2004/0234359 A1 * | 11/2004 | Mitchell et al. ............... 414/217 |
| 2008/0138175 A1 * | 6/2008 | Mitchell et al. ............... 414/217 |

* cited by examiner

*Primary Examiner* — Parviz Hassanzadeh
*Assistant Examiner* — Nathan K Ford
(74) *Attorney, Agent, or Firm* — Eschweiler & Associates, LLC (57) ABSTRACT

An end station for an ion implantation system is provided, wherein the end station comprises a process chamber configured to receive an ion beam. A load lock chamber is coupled to the process chamber and configured to selectively introduce a workpiece into the process chamber. An electrostatic chuck within the process chamber is configured to selectively translate through the ion beam, and a shield within the process chamber is configured to selectively cover at least a portion of a clamping surface of the electrostatic chuck to protect the clamping surface from one or more contaminants associated with the ion beam. A docking station within the process chamber selectively retains the shield, and a transfer mechanism is configured to transfer a workpiece between the load lock chamber and the electrostatic chuck, and to transfer the shield between the docking station and the clamping surface of the electrostatic chuck.

19 Claims, 7 Drawing Sheets

ELECTROSTATIC CHUCK SHIELDING MECHANISM

FIELD OF THE INVENTION

The present invention relates generally to ion implantation systems, and more specifically to systems and methods for shielding an electrostatic chuck in an ion implantation system.

BACKGROUND OF THE INVENTION

In the manufacture of semiconductor devices and other products, ion implantation systems are used to impart impurities, known as dopant elements, into workpieces, such as semiconductor wafers, display panels, or other workpieces. Conventional ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material workpieces. Alternatively, implanting ions generated from materials such as boron, gallium, or indium creates p-type extrinsic material portions in a semiconductor workpiece.

Conventional ion implantation systems include an ion source that ionizes a desired dopant element which is then accelerated to form an ion beam of prescribed energy. The ion beam is directed at a surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which helps to prevent dispersion of the ion beam by collisions with residual gas molecules and which minimizes the risk of contamination of the workpiece by airborne particulates.

The workpiece is typically introduced from atmosphere into the process chamber via a load lock chamber, wherein the workpiece is placed on an electrostatic chuck (ESC) within the process chamber, and generally held in place by electrostatic forces induced between the electrostatic chuck and the workpiece. When ion implantation is complete, the workpiece is removed from the ESC and placed back in the load lock chamber, or placed in another load lock chamber. In typical ion implantation processing, the ion beam is shut off after the implantation in order to prevent contamination within the process chamber, as well as energy savings, etc.

It is common, however, to intermittently adjust the ion beam, wherein a faraday cup along the beamline of the ion beam is utilized to measure properties of the ion beam, such as current, in order to "tune" the ion beam to acceptable parameters. During tuning, the ion beam strikes the faraday cup, and potentially sputters material from the faraday cup into the process chamber. Furthermore, during tuning, a clamping surface of the electrostatic chuck is typically exposed to such sputtered material, wherein the sputtered material can contact and/or build up on the clamping surface of the electrostatic chuck. However, it is generally undesirable to have a workpiece residing on the clamping surface of the electrostatic chuck during said tuning, since the sputtered contaminants have a high probability of causing defects on the workpiece, thus leading to losses in production.

Therefore, a need exists for a device for protecting the clamping surface of the electrostatic chuck during tuning, wherein sputtered material is generally prevented from contacting the clamping surface of the ESC.

SUMMARY OF THE INVENTION

The present invention overcomes the limitations of the prior art by providing an apparatus, system, and method for generally preventing contaminants from contacting the clamping surface of an electrostatic chuck. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an end station for an ion implantation system, wherein the end station comprises a process chamber configured to receive an ion beam. An electrostatic chuck configured to selectively translate a workpiece through the ion beam is further provided within the process chamber, and a shield configured to selectively overlie at least a portion of a clamping surface of the electrostatic chuck is also provided within the process chamber. The shield, such as a sacrificial workpiece, is, for example, configured to selectively protect at least a portion of the clamping surface from one or more contaminants associated with the ion beam A docking station is further positioned within the process chamber, wherein the docking station is configured to selectively support the shield within the process chamber during the translation of the workpiece through the ion beam.

In accordance with one exemplary aspect, the docking station comprises one or more brackets configured to generally support the shield about at least a portion of a periphery thereof. The one or more brackets, for example, are configured to selectively grip the shield. Alternatively, the docking station comprises one or more pins configured to generally support the shield along a surface thereof. In accordance with another example, the docking station further comprises a shield sensor configured to detect a presence of the shield selectively supported therein.

According to another exemplary aspect, the end station further comprising a transfer mechanism, wherein the transfer mechanism is configured to transfer the shield between the docking station and a position proximate to the clamping surface of the electrostatic chuck. The transfer mechanism, for example, comprises a transfer sensor configured to detect a presence of the shield during the transfer thereof. In another example, the transfer mechanism is further configured to place the shield on the clamping surface of the electrostatic chuck. In yet another example, the electrostatic chuck is further configured to selectively clamp the shield to the clamping surface thereof.

The end station of the present invention, for example, further comprises a load lock chamber operably coupled to the process chamber, wherein the load lock chamber is configured to selectively transfer the workpiece between an internal environment of the process chamber and an environment external to the process chamber. The transfer mechanism, for example, is further configured to selectively transfer the workpiece between the load lock chamber and the electrostatic chuck. In accordance with yet another example, the transfer mechanism is further configured to selectively transfer the shield between the docking station and the load lock chamber, wherein the load lock chamber is further configured to selectively transfer the shield between the internal environment of the process chamber and the environment external to the process chamber.

In accordance with another example, the docking station is configured to fixedly position the shield within the process chamber, wherein the electrostatic chuck is further configured to selectively translate the clamping surface thereof with respect to the shield. Accordingly, at least a portion of the clamping surface is protected from particulate contamination during tuning of the ion beam.

A method for maintaining nominal de-clamp times for an electrostatic chuck is further provided, wherein an ion beam is provided in a process chamber. The electrostatic chuck, for example, resides within the process chamber and is configured to electrostatically clamp a workpiece to a clamping surface thereof. According to the method, the clamping surface of the electrostatic chuck, for example, is shielded during tuning of the ion beam, wherein the tuning occurs when no workpiece resides within the process chamber, and wherein the clamping surface of the electrostatic chuck is generally protected from sputtered contaminants associated with the ion beam.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally towards an apparatus, system, and method for protecting a clamping surface of an electrostatic chuck in an ion implantation system. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 1:
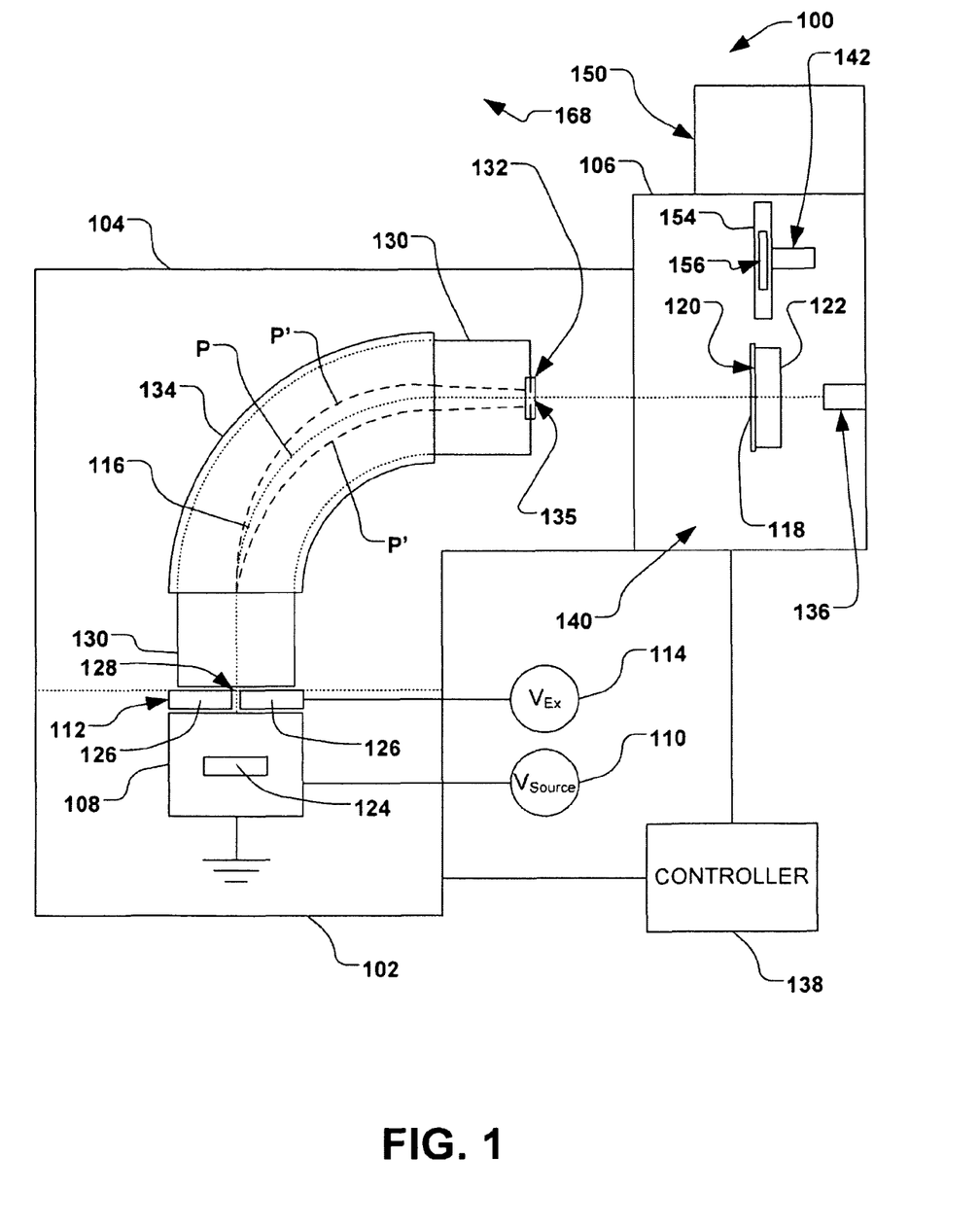
FIG. 1 is a schematic of an exemplary ion implantation system according to one aspect of the present invention.

In order to gain a better understanding of the invention, FIG. 1 illustrates an exemplary ion implantation system 100, wherein the exemplary ion implantation system is suitable for implementing one or more aspects of the present invention. It should be noted that although the ion implantation system 100 is illustrated as one example, the present invention can be practiced using various other types of ion implantation apparatuses and systems, such as high energy systems, low energy systems, or other implantation systems, and all such systems are contemplated as falling within the scope of the present invention.

The ion implantation system 100, for example, comprises a terminal 102, a beamline assembly 104, and a process chamber 106 (also referred to generically as an end station), wherein the terminal comprises an ion source 108 powered by a source power supply 110. The terminal 102 further comprises an extraction assembly 112 powered by an extraction power supply 114 to extract ions from the ion source 108 and thereby to provide an extracted ion beam 116 to the beamline assembly 104. The extraction assembly 112, in conjunction with the beamline assembly 104, for example, are operable to direct the ions of the ion beam 116 toward a workpiece 118 (e.g., a semiconductor workpiece, display panel, etc.) residing on a clamping surface 120 of an electrostatic chuck (ESC) 122 in the end station 106 for implantation thereof at a given energy level.

In one example, the ion source 108 comprises a plasma chamber (not shown) wherein ions of a process gas or species are energized at a high positive potential $V_{source}$. It should be noted that generally, positive ions are generated, although the present invention is also applicable to systems wherein negative ions are generated by the ion source 108. The extraction assembly 112 further comprises a plasma electrode 124 and one or more extraction electrodes 126, wherein the plasma electrode is biased with respect to the one or more extraction electrodes, but floats with respect to the plasma within the ion source 108 (e.g., the plasma electrode at 120 kV with respect to the workpiece 118, wherein the workpiece is typically grounded). The one or more extraction electrodes 126, for example, are biased at a voltage less than that of the plasma electrode 124 (e.g., an extraction voltage $V_{Extract}$ of 0-100 kV). The negative relative potential at the one or more extraction electrodes 126 with respect to the plasma creates an electrostatic field operable to extract and accelerate the positive ions out of the ion source 108. For example, the one or more extraction electrodes 126 have one or more extraction apertures 128 associated therewith, wherein positively charged ions exit the ion source 108 through the one or more extraction apertures to form the ion beam 116, and wherein a velocity of the extracted ions is generally determined by the potential $V_{Extract}$ provided to the one or more extraction electrodes.

The beamline assembly 104, according to one aspect of the invention, comprises a beamguide 130 having an entrance near the ion source 108 (e.g., associated with the extraction aperture 128) and an exit with a resolving plate 132, as well as a mass analyzer 134 that receives the extracted ion beam 116 and creates a dipole magnetic field to pass only ions of appropriate charge-to-mass ratio or range thereof (e.g., a mass analyzed ion beam having ions of a desired mass range) to the workpiece 118 positioned in the process chamber 106. The ionization of source materials in the ion source 108 generates a species of positively charged ions having a desired atomic mass. However, in addition to the desired species of ions, the ionization process will also generate a proportion of ions having other atomic masses as well. Ions having an atomic mass above or below the proper atomic mass are not suitable for implantation and are referred to as undesirable species. The magnetic field generated by the mass analyzer 134 generally causes the ions in the ion beam 116 to move in a curved trajectory, and accordingly, the magnetic field is established such that only ions having an atomic mass equal to the atomic mass of the desired ion species traverse the beam path P to the process chamber 106.

In accordance with still another aspect of the invention, the resolving plate 132 at the exit of the beamguide 130 operates in conjunction with the mass analyzer 134 to eliminate undesirable ion species from the ion beam 116 which have an atomic mass close to, but not identical, to the atomic mass of the desired species of ions. The resolving plate 132, for example, is further comprised of vitreous graphite or another material such as tungsten or tantalum, and includes one or more elongated resolving apertures 135, wherein the ions in the ion beam 116 pass through the aperture as they exit the beamguide 130. At the resolving plate 132, a dispersion of ions from the path P of the ion beam 116 (e.g., illustrated at P') is at its minimum value, wherein a width of the ion beam (P'-P') is at a minimum where the ion beam 116 passes through the resolving aperture(s) 135.

The ion implantation system 100, for example, further comprises a faraday 136 coupled thereto, wherein the faraday is positioned along the path P of the ion beam 116 generally downstream of the workpiece 118, and is operable to intersect the path of the ion beam when the workpiece does not intersect the path. Accordingly, the faraday 136 is configured to measure characteristics of the ion beam and/or substantially confine the ion beam 116 within the process chamber 106 downstream of the workpiece 118. For example, the faraday 136 that can be operatively coupled to a controller 138, wherein the controller is operable to determine whether characteristics of the ion beam are satisfactory for ion implantation. It will be appreciated that the controller 138 may comprise a processor, computer system, and/or operator for overall control of the system 100 (e.g., a computer system in conjunction with input by an operator). The faraday 136, for example, comprises a generally hollow cylinder lined with graphite, wherein particle contamination caused by sputtering of the ion beam 116 is minimized.

Figure 2:
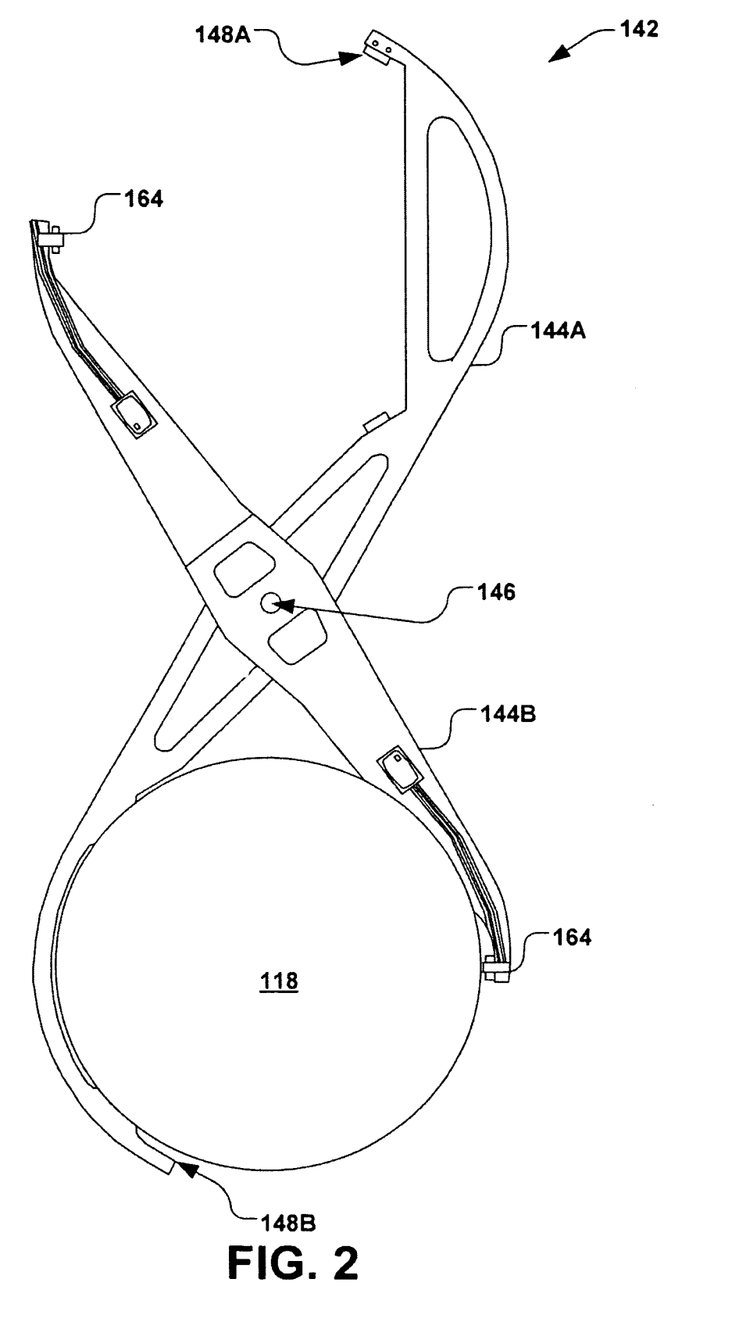
FIG. 2 is a plan view of an exemplary transfer mechanism according to another aspect of the invention.

In another example, the workpiece 118 is introduced to an internal environment 140 of the process chamber 106 via a transfer mechanism 142, as will be discussed further infra. An exemplary transfer mechanism 142 is illustrated in FIG. 2, wherein individual arms 144A and 144B are configured to individually rotate about an axis 146, wherein the transfer mechanism is configured to grasp the workpiece 118 in either of gripping locations 148A and 148B. The transfer mechanism 142 of FIG. 1, for example, is further configured to transfer the workpiece 118 between a load lock chamber 150 and the internal environment 140, wherein the transfer mechanism is operable to translate and/or rotate in one or more directions.

The present invention contemplates that particulate contamination (not shown) can arise from the ion beam 116 striking various surfaces such as the faraday 136, resolving plate 132, resolving aperture(s) 135, extraction apertures 128, or other surfaces within the system 100, wherein particles are sputtered from the surfaces. Of particular concern is particulate contamination within the process chamber 106, wherein it is believed that sputtering of materials from the ion beam 116 impacting the faraday 136 during tuning of the ion beam can lead to an accumulation of the particulate contamination on the clamping surface 120 of the electrostatic chuck 122. Conventionally, the clamping surface 120 of the electrostatic chuck 122 is exposed during tuning of the ion beam 116, as it is typically undesirable expose production workpieces 118 (workpieces that are to have devices formed thereon) to the particulate contamination, as lost production may result. However, it is presently believed by the inventors that by leaving the clamping surface 120 of the ESC 122 exposed during beam tuning, the particulate contamination that ultimately builds up on the clamping surface leads to an increase in de-clamping time for removing workpieces 118 from the clamping surface.

It is presently contemplated by the inventors that an increase in particulate contamination on the clamping surface 120 of the ESC increases an RC time constant for discharging of the ESC, thus deleteriously extending the de-clamping time needed to allow for removal of the workpiece 118 from the ESC. A long discharge time not only reduces productivity, but it also leads to breakage of workpieces 118 if an attempt to pull the workpiece from the ESC 122 via the transfer mechanism 142 is made before the electrostatic charge between the workpiece and the ESC is adequately discharged. Further, it is believed that particulate contamination on the clamping surface 120 can lead to an increase in backside particle contamination issues when the particulate contamination adheres to the workpiece 118 when the workpiece is removed from the ESC 122 after the ion implantation.

Figure 3A:
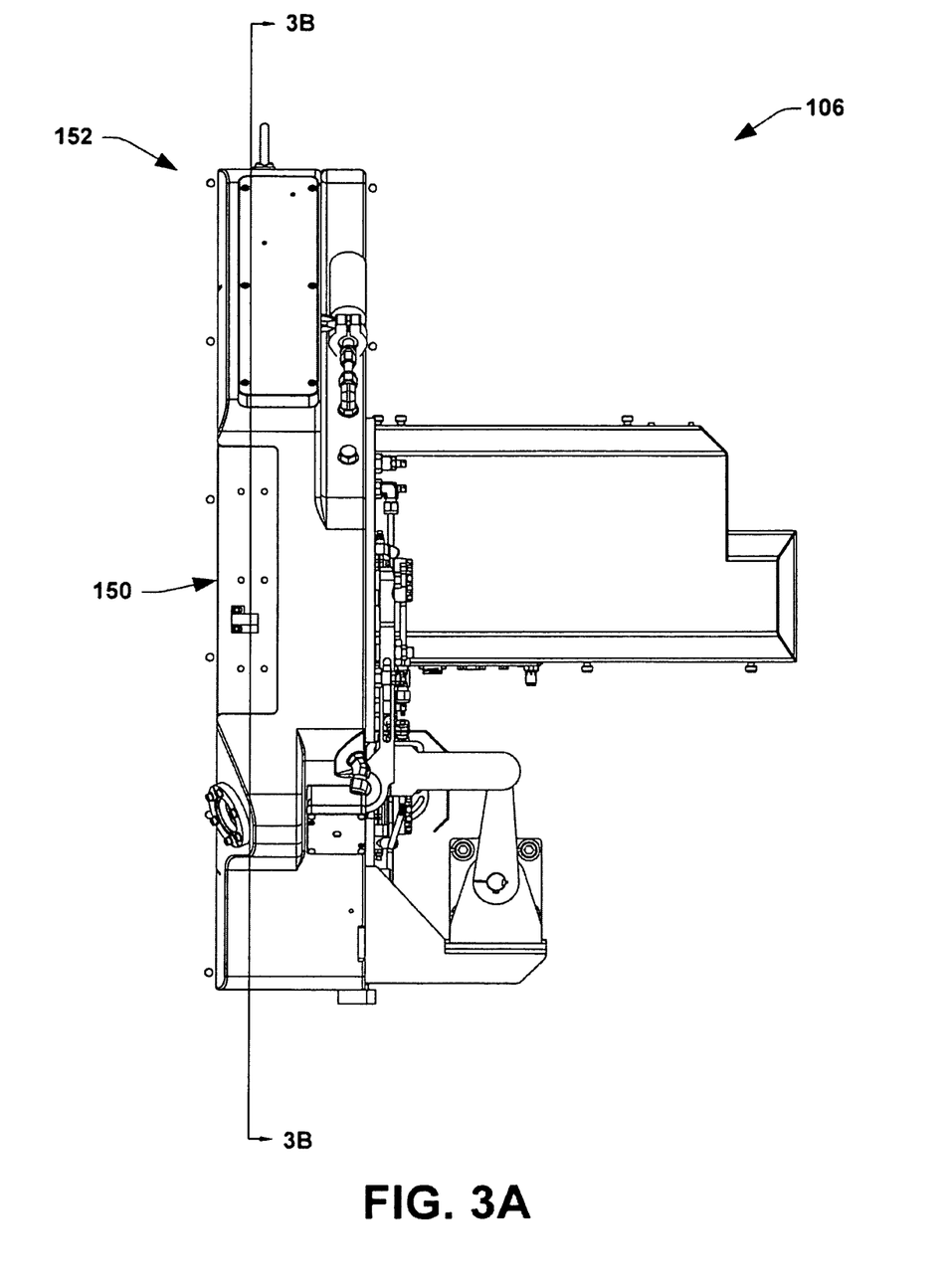
FIG. 3A is a side view of an exemplary process chamber according to another exemplary aspect.
Figure 3B:
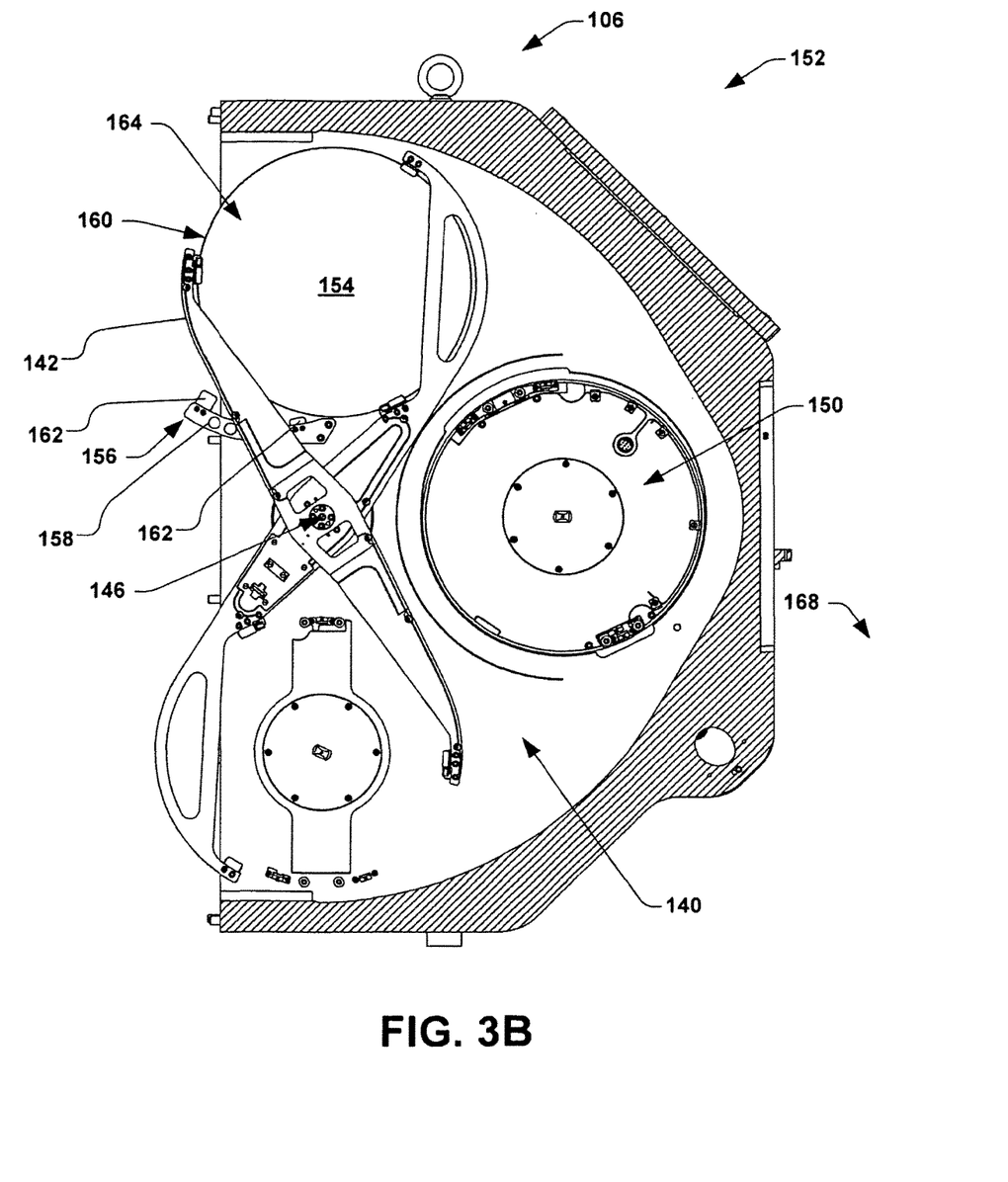
FIG. 3B is a cut-away view of the exemplary process chamber of FIG. 3A according to another exemplary aspect.

Thus, the present invention provides an apparatus and method for reducing the effect that particulate contaminants play in workpiece de-clamping, as well in backside particle contamination of workpieces. Referring now to FIGS. 3A and 3B, a portion 152 of the process chamber 106 of FIG. 1 is illustrated, wherein the present invention can be appreciated in greater detail. It should be again noted that the ion implantation system 100 of FIG. 1 and process chamber 106 of FIGS. 3A-3B are illustrated as examples, and that the present invention can be practiced using various other types of ion implantation apparatus and systems and process chambers, such as high energy systems, low energy systems, or other implantation systems. All such systems and apparatus are thus contemplated as falling within the scope of the present invention.

The portion 152 of the process chamber 106 of FIG. 3A is illustrated in cross-section in FIG. 3B, wherein, for example, a shield 154 is provided, and wherein the shield is configured to selectively overlie at least a portion of a clamping surface 120 of the electrostatic chuck 122 of FIG. 1. For example, the shield 154 is configured to overlie the entire clamping surface 120 of FIG. 1. Accordingly, when placed on the clamping surface 120 (as will be discussed infra), the shield is configured to protect the at least a portion of the clamping surface from the above-described particulate contaminants associated with the ion beam. The shield 154, for example, comprises a sacrificial workpiece composed of the same material as the workpiece 118 of FIG. 1. Alternatively, the shield 154 is comprised of another material, such as carbon, wherein the shield is operable to protect the clamping surface 120 of the ESC 122.

Figure 4:
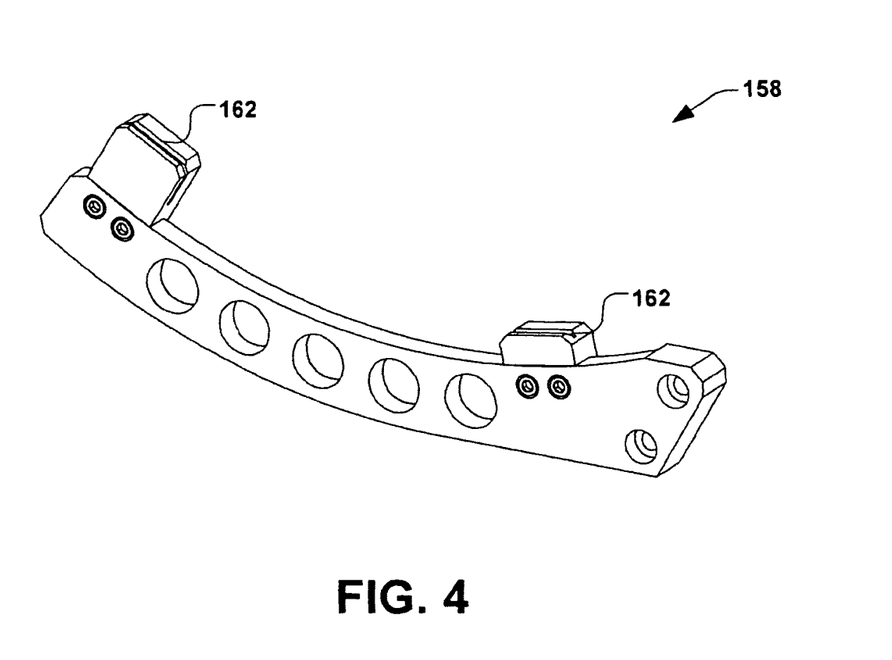
FIG. 4 is a perspective view of an exemplary bracket according to yet another exemplary aspect of the invention.

In accordance with the invention, a docking station 156 is further provided, wherein the docking station is generally positioned within the process chamber 106, and wherein the docking station is configured to selectively support the shield 154 within the process chamber. The docking station 156, as illustrated in FIG. 3B, for example, comprises one or more brackets 158 configured to generally support the shield 154 about at least a portion of a periphery 160 thereof. The one or more brackets 158, in one example, are configured to selectively grip the shield 154, wherein the one or more brackets are selectably movable with respect to the process chamber 106. Alternatively, the one or more brackets 158 are generally stationary with respect to the process chamber 106. In the present example, the shield 154 and one or more brackets 158 are generally positioned vertically, wherein the shield is configured to rest in the one or more brackets by gravity about the periphery 160 thereof. For example, one or more keepers 162 are provided in the one or more brackets 158, as illustrated in greater detail in FIGS. 4 and 5, for contacting the periphery 160 of the shield 154 of FIG. 3B. Should the process chamber 106 be oriented horizontally (not shown), the docking station 156, for example, can comprise one or more pins (not shown), wherein the one or more pins are configured to support a surface (e.g., a bottom generally planar surface—not shown) of the shield 154.

Figure 5:
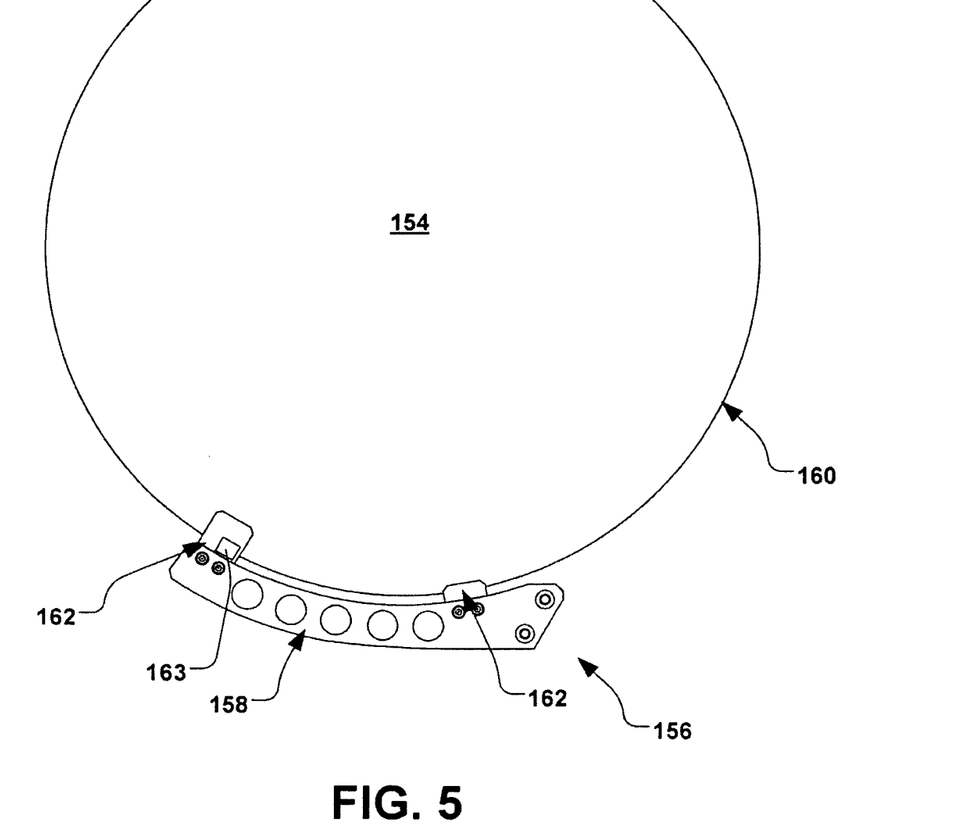
FIG. 5 is a plan view of an exemplary docking station in accordance with still another exemplary aspect.

As illustrated in FIG. 5, in accordance with another example, the docking station 156 further comprises a shield sensor 163 configured to detect a presence of the shield 154 (e.g., the periphery 160 of the shield) selectively supported therein. Accordingly, the presence of the shield 154 in the docking station 156 can be fed to the controller 138 of FIG. 1 for further control of the system 100. According to another example, the transfer mechanism 142 of FIG. 2 further comprises a transfer sensor 164 configured to detect a presence of the shield 154 during the transfer thereof, wherein the transfer sensor and shield sensor 163 of FIG. 5, for example, provide positional information of the workpiece 118 and/or shield 154 within the process chamber 106 to the controller 138 of FIG. 1.

In accordance with one exemplary aspect of the invention, the transfer mechanism 142 of FIG. 3B, for example, is configured to transfer the shield 154 between the docking station 156 and a position proximate to the clamping surface 120 of the electrostatic chuck 122 of FIG. 1. In one example, the transfer mechanism 142 is further configured to place the shield 154 on the clamping surface 120 of the electrostatic chuck 122, wherein the electrostatic chuck can further electrostatically attract the shield thereto. In yet another example, the transfer mechanism 142 is further configured to selectively transfer the shield 154 between the docking station 156 and the load lock chamber 150, as illustrated in FIG. 3B, and wherein the load lock chamber is further configured to selectively transfer the shield between the internal environment 140 of the process chamber 106 and an environment 168 external to the process chamber of FIG. 1. According to yet another example, the transfer mechanism 142 is further configured to selectively transfer the workpiece 118 of FIG. 1 between the load lock chamber 150 and the electrostatic chuck 122, wherein the same transfer mechanism is configured to transfer both the workpiece and the shield 154. Alternatively, separate transfer mechanisms (not shown) can be utilized for transferring the workpiece 118 and the shield 154.

According to still another example, the docking station 156 is configured to fixedly position the shield 154 within the process chamber 106, wherein the electrostatic chuck 122 of FIG. 1 is further configured to selectively translate the clamping surface 120 thereof with respect to the shield, therein selectively protecting at least a portion of the clamping surface. Alternatively, the docking station 156, itself, is configured to selectively translate the shield 154 with respect to the electrostatic chuck 122, therein selectively protecting the at least a portion of the clamping surface 120. It should be noted that the shield 154 can be placed on the clamping surface 120 of the ESC 122, or, alternatively, be placed proximate to the clamping surface, wherein the shield generally protects the clamping surface while not generally contacting the clamping surface.

Figure 6:
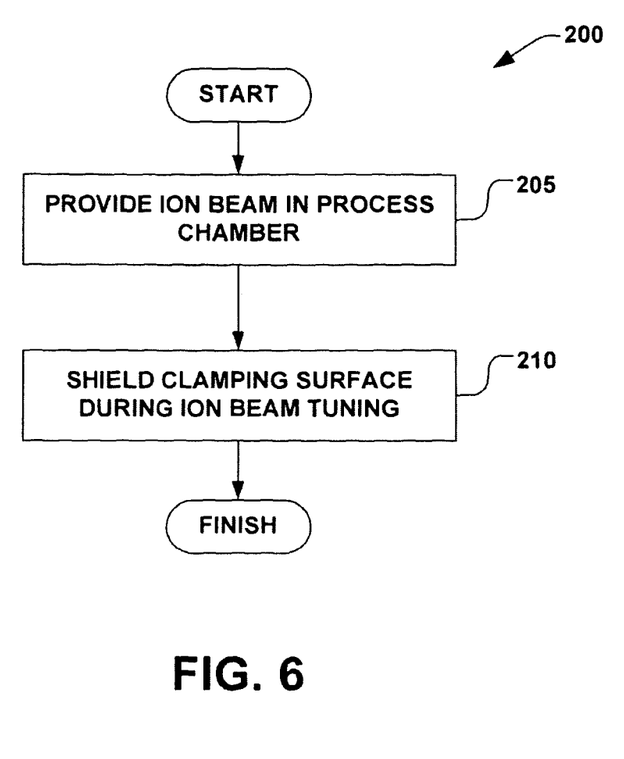
FIG. 6 is a block diagram of an exemplary method for improving de-clamp times for an electrostatic chuck according to another exemplary aspect of the invention.

In accordance with yet another aspect, FIG. 6 illustrates an exemplary method 200 for maintaining nominal workpiece de-clamp times for an electrostatic chuck. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 200 begins with providing an ion beam in a process chamber in act 205, wherein the electrostatic chuck resides within the process chamber and is configured to electrostatically clamp a workpiece to a clamping surface thereof. In act 210, the clamping surface of the electrostatic chuck is shielded during tuning of the ion beam, when no production workpieces reside within the process chamber. Accordingly, the clamping surface of the electrostatic chuck is generally protected from sputtered contaminants associated with tuning of the ion beam.

For example, shielding the clamping surface of the electrostatic chuck comprises transferring the shield 154 of FIG. 3 from the docking station 156 within the process chamber 106 to a position proximate to the clamping surface 120 of the electrostatic chuck 122 of FIG. 1. The shield 154 can be further placed on the clamping surface 120 and electrostatically clamped to the clamping surface of the electrostatic chuck via electrostatic force. Alternatively, shielding the clamping surface of the electrostatic chuck of act 210 of FIG. 6 comprises moving the electrostatic chuck to a shield region, wherein the clamping surface is generally protected from the sputtered contaminants.

In accordance with yet another exemplary aspect, the shield is subscribed to a change-out schedule, wherein the shield is transferred to the load lock and removed from the process chamber, and wherein a new or cleaned shield is transferred back into the process chamber. For example, for every n workpieces implanted with ions via the implantation system 100, wherein n is a positive integer, a new shield, such as a sacrificial workpiece, is inserted, wherein the previous shield is removed from the process chamber. Further, if the shield, itself, is a possible cause of particle contamination problems within the process chamber, the shield can be rotated to the load lock via the transfer mechanism, and be removed from the process chamber.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An end station for an ion implantation system, the end station comprising:
    a process chamber configured to receive an ion beam;
    an electrostatic chuck configured to selectively translate a workpiece through the ion beam;
    a shield, wherein the shield is configured to selectively overlie at least a portion of a clamping surface of the electrostatic chuck, therein selectively protecting the at least a portion of the clamping surface from one or more contaminants associated with the ion beam; and
    a docking station positioned within the process chamber, wherein the docking station is configured to selectively support the shield within the process chamber during the translation of the workpiece through the ion beam.

2. The end station of claim 1, wherein the docking station comprises one or more brackets configured to generally support the shield about at least a portion of a periphery thereof.

3. The end station of claim 2, wherein the one or more brackets are configured to selectively grip the shield.

4. The end station of claim 1, wherein the docking station comprises one or more pins configured to generally support the shield along a surface thereof.

5. The end station of claim 1, wherein the docking station further comprises a shield sensor configured to detect a presence of the shield selectively supported therein.

6. The end station of claim 1, further comprising a transfer mechanism, wherein the transfer mechanism is configured to transfer the shield between the docking station and a position proximate to the clamping surface of the electrostatic chuck.

7. The end station of claim 6, wherein the transfer mechanism comprises a transfer sensor configured to detect a presence of the shield during the transfer thereof.

8. The end station of claim 6, wherein the transfer mechanism is further configured to place the shield on the clamping surface of the electrostatic chuck.

9. The end station of claim 8, wherein the electrostatic chuck is further configured to selectively clamp the shield to the clamping surface thereof.

10. The end station of claim 6, further comprising a load lock chamber operably coupled to the process chamber, wherein the load lock chamber is configured to selectively transfer the workpiece between an internal environment of the process chamber and an environment external to the process chamber, and wherein the transfer mechanism is further configured to selectively transfer the workpiece between the load lock chamber and the electrostatic chuck.

11. The end station of claim 10, wherein the transfer mechanism is further configured to selectively transfer the shield between the docking station and the load lock chamber, and wherein the load lock chamber is further configured to selectively transfer the shield between the internal environment of the process chamber and the environment external to the process chamber.

12. The end station of claim 10, wherein the process chamber comprises a vacuum chamber, wherein the internal environment is a substantial vacuum, and wherein the environment external to the process chamber is substantially atmospheric.

13. The end station of claim 1, wherein the shield comprises a sacrificial workpiece.

14. The end station of claim 1, wherein the docking station is configured to fixedly position the shield within the process chamber, and wherein the electrostatic chuck is further configured to selectively translate the clamping surface thereof with respect to the shield, therein selectively protecting the at least a portion of the clamping surface.

15. The end station of claim 1, wherein the docking station is configured to selectively translate the shield with respect to the electrostatic chuck, therein selectively protecting the at least a portion of the clamping surface.

16. An end station for an ion implantation system, the end station comprising:
    a process chamber configured to receive an ion beam;
    a load lock chamber operably coupled to the process chamber, wherein the load lock chamber is configured to selectively introduce a workpiece to an interior environment of the process chamber;
    an electrostatic chuck generally positioned within the process chamber and configured to selectively translate through the ion beam;
    a shield generally positioned within the process chamber, wherein the shield is configured to selectively cover at least a portion of a clamping surface of the electrostatic chuck, therein selectively protecting the at least a portion of the clamping surface from one or more contaminants associated with the ion beam;
    a docking station generally positioned within the process chamber and configured to selectively retain the shield within the process chamber; and
    a transfer mechanism, wherein the transfer mechanism is configured to transfer a workpiece between the load lock chamber and the electrostatic chuck, and wherein the transfer mechanism is further configured to transfer the shield between the docking station and a position proximate to the clamping surface of the electrostatic chuck.

17. A method for maintaining nominal de-clamp times for an electrostatic chuck, the method comprising:
    providing an ion beam in a process chamber, wherein the electrostatic chuck resides within the process chamber and is configured to electrostatically clamp a workpiece to a clamping surface thereof; and
    shielding the clamping surface of the electrostatic chuck when no workpiece resides within the process chamber, wherein the clamping surface of the electrostatic chuck is generally protected from sputtered contaminants associated with the ion beam, and wherein shielding the clamping surface of the electrostatic chuck comprises transferring a shield from a docking station within the process chamber to a position proximate to the clamping surface of the electrostatic chuck.

18. The method of claim 17, further comprising placing the shield on the clamping surface and electrostatically clamping the shield to the clamping surface of the electrostatic chuck.

19. The method of claim 17, wherein transferring the shield from the docking station to the position proximate to the clamping surface utilizes a transfer mechanism for transferring a workpiece from a load lock chamber to the clamping surface of the electrostatic chuck.

* * * * *